US012772800B2

(12) United States Patent
Yu et al.

(10) Patent No.: US 12,772,800 B2
(45) Date of Patent: Oct. 20, 2026

(54) METHOD FOR MONITORING STEP HEIGHT OF EPITAXIAL LAYER OF CMOS DEVICE

(71) Applicant: Shanghai Huali Integrated Circuit Corporation, Shanghai (CN)

(72) Inventors: Zexiao Yu, Shanghai (CN); Ren Li, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 412 days.

(21) Appl. No.: 18/646,552

(22) Filed: Apr. 25, 2024

(65) Prior Publication Data

US 2025/0054814 A1 Feb. 13, 2025

(30) Foreign Application Priority Data

Aug. 10, 2023 (CN) ......................... 202311008865.8

(51) Int. Cl.
*H10P 74/20* (2026.01)
*G01B 7/06* (2006.01)

(52) U.S. Cl.
CPC .............. *H10P 74/203* (2026.01); *G01B 7/06* (2013.01)

(58) Field of Classification Search
CPC ...... H10P 74/203; H10P 74/27; H10P 74/277; H10P 74/207; H10P 74/23; G01B 7/06
See application file for complete search history.

(56) References Cited

FOREIGN PATENT DOCUMENTS

| | | | | |
|---|---|---|---|---|
| CN | 115547868 A | * 12/2022 | .............. | H10P 74/23 |
| CN | 119446947 A | * 2/2025 | ............ | H10P 74/235 |

OTHER PUBLICATIONS

Yin, Heyu, Lin Li, and Andrew J. Mason. "Screen-printed planar metallization for lab-on-CMOS with epoxy carrier." 2016 IEEE International Symposium on Circuits and Systems (ISCAS). IEEE, 2016. (Year: 2016).*

* cited by examiner

*Primary Examiner* — Norman D Richards
*Assistant Examiner* — Ethan Edward Cutler
(74) *Attorney, Agent, or Firm* — Quarles & Brady LLP

(57) ABSTRACT

This application discloses a method for monitoring SH of an epitaxial layer of a CMOS device, fabricating a measurement reference device, AA and STI structures of the measurement reference device being the same as those of the CMOS device to be monitored, polysilicon lines being formed on the AA and STI structures of the measurement reference device, the polysilicon lines on the AA structures being connected in series to obtain a first polysilicon line string, the polysilicon lines on the STI structures being connected in series to obtain a second polysilicon line string; obtain current I1 flowing through the first polysilicon line string and current I2 flowing through the second polysilicon line string; and performing calculation according to I1 and I2 to obtain SH of an epitaxial layer of the measurement reference device as SH of an epitaxial layer of the CMOS device to be monitored.

6 Claims, 3 Drawing Sheets

METHOD FOR MONITORING STEP HEIGHT OF EPITAXIAL LAYER OF CMOS DEVICE

CROSS-REFERENCES TO RELATED APPLICATIONS

This application claims the priority to Chinese patent application No. 202311008865.8, filed on Aug. 10, 2023, and entitled "METHOD FOR MONITORING STEP HEIGHT OF EPITAXIAL LAYER OF CMOS DEVICE", the disclosure of which is incorporated herein by reference in entirety.

TECHNICAL FIELD

This application relates to an integrated circuit manufacturing technology and in particular to a method for monitoring Step Height (SH) of an epitaxial layer of a CMOS device.

BACKGROUND

Bipolar-CMOS-DMOS (BCD) process is a single-chip integration process technology that enables the fabrication of Bipolar, CMOS, and DMOS devices on the same chip. Due to the combination of the advantages of the three devices mentioned above, BCD-based products can integrate complex control functions, making it the mainstream process technology for power integrated circuits. In the BCD platform process, the doped buried layer process or deep well process is usually the basic process step in the BCD process flow.

At present, ion implantation technology is commonly used in the doped buried layer process of related technologies. Compared with the deep well process, ion implantation can be used to adjust the process parameters of ion implantation in the doped buried layer, resulting in a thicker implantation concentration and deeper implantation depth. Therefore, in terms of performance such as latch-up suppression and isolation, the doped buried layer process is superior to the deep well process. After doping ions are implanted into the substrate, relative to other parts of the substrate, the part of the substrate corresponding to ion implantation has a higher ion concentration, which leads to accelerated oxidation of silicon in the part of the substrate corresponding to the ion implantation area in the subsequent oxidation process, forming a partially oxidized layer in the doped buried layer. After the partially oxidized layer is peeled off for epitaxial growth, it will lead to the formation of a step in the epitaxial layer, that is, there is a step height in the epitaxial layer. In the subsequent process, there may be a problem that the exposure process window is influenced by the step height.

Step height (SH) is an important key parameter in the CMOS process, which influences the performance of the MOS device. A conventional process uses a dense Optical Critical Dimension (OCD) structure to monitor the inline SH. For different device structures, due to the loading effect in processes such as Chemical Mechanical Polishing (CMP), there are significant differences in SH of different device structures. Inline Optical Critical Dimension Step Height (inline OCD SH) cannot reflect the SH differences of different device structures. Therefore, at present, there is a lack for a method for monitoring SH of different device structures.

BRIEF SUMMARY

The technical problem to be solved by this application is to provide a method for monitoring Step Height (SH) of an epitaxial layer of a CMOS device, which uses electrical structures to test SH of epitaxial layers corresponding to different CMOS device structures, can achieve differential SH monitoring, can reflect the SH difference of different device structures, and is low in cost.

In order to solve the technical problem, the method for monitoring step height of an epitaxial layer of a CMOS device provided by this application includes:

S1: determining a CMOS device to be monitored and fabricating a measurement reference device, active area and shallow trench isolation structures of the measurement reference device being the same as those of the CMOS device to be monitored, polysilicon lines being formed on the active area and shallow trench isolation structures of the measurement reference device, the polysilicon lines on the active area structures of the measurement reference device having the same front-rear length and the same left-right width, the polysilicon lines on the shallow trench isolation structures of the measurement reference device having the same front-rear length and the same left-right width, the polysilicon lines on the active area structures of the measurement reference device being connected in series through back-end connecting lines to obtain a first polysilicon line string, the polysilicon lines on the shallow trench isolation structures of the measurement reference device being connected in series through back-end connecting lines to obtain a second polysilicon line string;

S2: applying test voltage U respectively to the first polysilicon line string and the second polysilicon line string of the measurement reference device to respectively measure current I1 flowing through the first polysilicon line string and current I2 flowing through the second polysilicon line string;

S3: performing calculation to obtain step height SH of an epitaxial layer of the measurement reference device according to the following formula:

$$SH = \rho * L2 * I2/(W2 * U) - \rho * L1 * I1/(W1 * U)$$

where ρ is the resistivity of polysilicon, L2 is the front-rear length of the polysilicon lines on the shallow trench isolation structures of the measurement reference device, W2 is the left-right width of the polysilicon lines on the shallow trench isolation structures of the measurement reference device, L1 is the length of the polysilicon lines on the active area structures of the measurement reference device, and W1 is the left-right width of the polysilicon lines on the active area structures of the measurement reference device; and S4: using the step height of the epitaxial layer of the measurement reference device as step height of an epitaxial layer of the CMOS device to be monitored.

According to some embodiments, in step S1, the CMOS device to be monitored and the measurement reference device are fabricated in the same process.

According to some embodiments, the critical dimension of the polysilicon lines on the active area structures of the measurement reference device is 30%-90% of the left-right width of the active area structures;

the length of the polysilicon lines on the active area structures of the measurement reference device is 60%-90% of the front-rear width of the active area structures;

the critical dimension of the polysilicon lines on the shallow trench isolation structures of the measurement reference device is 30%-90% of the left-right width of the shallow trench isolation structures;

the length of the polysilicon lines on the shallow trench isolation structures of the measurement reference device is 60%-90% of the front-rear width of the shallow trench isolation structures.

According to some embodiments, the CMOS device to be monitored and the measurement reference device both have a distribution that the active area structures are spaced apart from the shallow trench isolation structures, and length directions of both the active area structures and the shallow trench isolation structures are a front-rear direction;

for the measurement reference device, the polysilicon lines on all active area structures are arranged along the length direction, with front ends aligned, and the polysilicon lines on all shallow trench isolation structures are arranged along the length direction, with rear ends aligned;

for the measurement reference device, front ends of the polysilicon lines on all shallow trench isolation structures are located at rear of front ends of the polysilicon lines on the active arear structures, and rear ends of the polysilicon lines on all shallow trench isolation structures are located at front of rear ends of the polysilicon lines on the active arear structures.

According to some embodiments, the back-end connecting lines on the active area structures and the back-end connecting lines on the shallow trench isolation structures of the measurement reference device each include a polysilicon contact hole, a first metal layer, a metal layer via and a second metal layer;

the first metal layer is short-circuited to the polysilicon line through the polysilicon contact hole;

the second metal layer is short-circuited to the first metal layer through the metal layer via.

According to some embodiments, the back-end connecting lines on the active area structures and the back-end connecting lines on the shallow trench isolation structures of the measurement reference device are in a mirror symmetric distribution.

The method for monitoring step height of an epitaxial layer of a CMOS device provided in this application designs a novel Test Socket Kit (TSK), uses electrical structures to test SH of epitaxial layers corresponding to different CMOS device structures, can achieve differential SH monitoring, can reflect the SH difference of different device structures, can compensate for the limitation of inline measurement of SH of epitaxial layers, and can reduce the cost of Transmission Electron Microscope (TEM) analysis.

BRIEF DESCRIPTION OF THE DRAWINGS

In order to describe the technical solution of this application more clearly, the drawings required for use in this application will be briefly introduced below. Apparently, the drawings described below are only some embodiments of this application. Those skilled in the art may obtain other drawings according to these drawings without contributing any inventive labor.

DETAILED DESCRIPTION OF THE EMBODIMENTS

The technical solutions in the embodiments of this application will be described below clearly and completely with reference to the drawings in the embodiments of this application. Obviously, the described embodiments are only a part of the embodiments of this application, not all of them. Based on the embodiments of this application, all other embodiments obtained by those skilled in the art without contributing any inventive labor still fall within the scope of protection of this application.

Words such as "first" and "second" used in this application do not indicate any order, quantity, or importance, but are only intended to distinguish different components. Words such as "including" or "comprising" refer to a component or object that appears before the word, including those listed after the word and their equivalents, without excluding other components or objects. Words such as "connecting" or "connected" are not limited to physical or mechanical connection, but may include electrical connection, whether direct or indirect. "Up", "down", "left", "right", "front", "back" and the like are only intended to represent relative positional relationships. When the absolute position of the described object changes, the relative positional relationship may also change accordingly.

It is to be understood that, without conflict, the embodiments of this application and the features in the embodiments may be combined with each other.

Embodiment 1

A method for monitoring Step Height (SH) of an epitaxial layer of a CMOS device includes the following steps:

In S1, a CMOS device to be monitored is determined, and the CMOS device to be monitored and a measurement reference device are fabricated in the same process.

Figure 1:
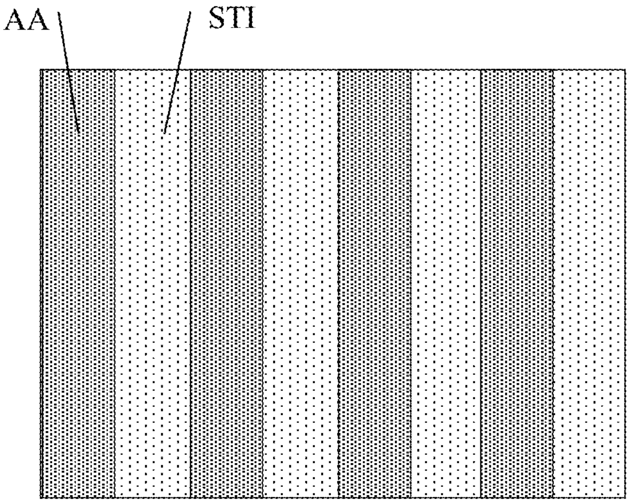
FIG. 1 illustrates a schematic diagram of AA and STI structures of a measurement reference device and a CMOS device to be monitored in a method for monitoring SH of an epitaxial layer of a CMOS device according to an embodiment of this application.

Active Area (AA) and Shallow Trench Isolation (STI) structures of the measurement reference device are the same as those of the CMOS device to be monitored, as illustrated in FIG. 1.

Figure 2:
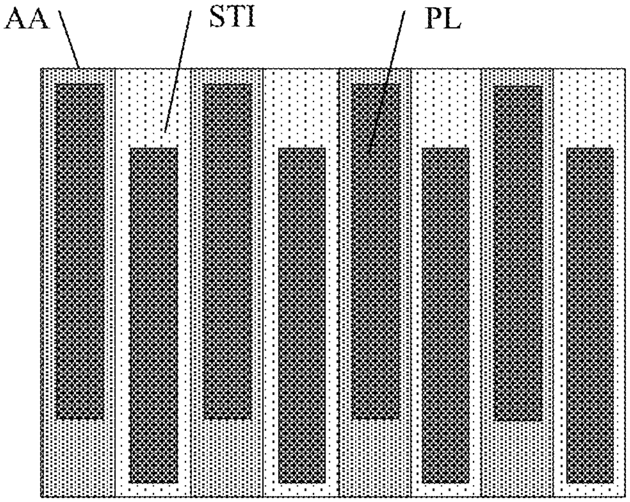
FIG. 2 illustrates a structural schematic diagram of a measurement reference device formed with polysilicon lines in a method for monitoring SH of an epitaxial layer of a CMOS device according to an embodiment of this application.
Figure 3:
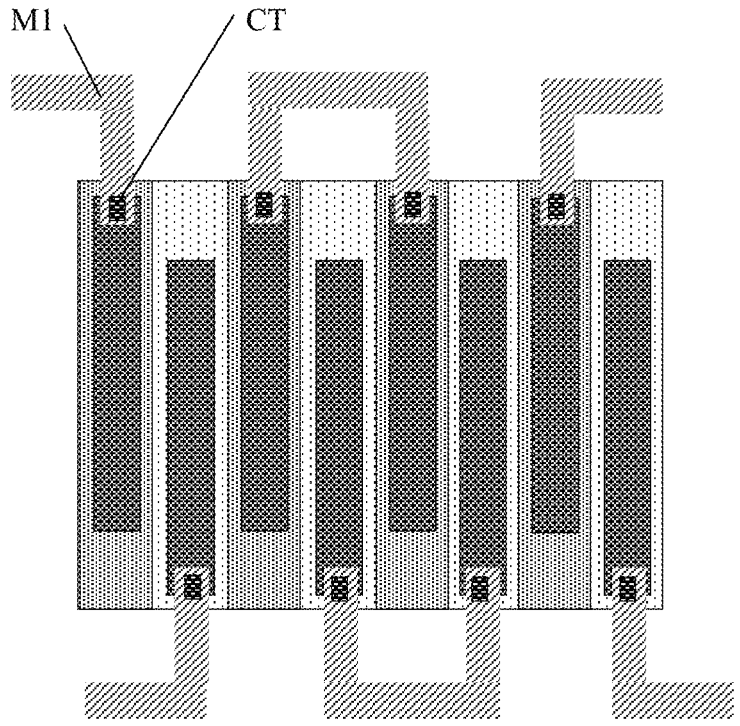
FIG. 3 illustrates a schematic diagram after a first metal layer M1 is short-circuited to a polysilicon line PL through a polysilicon contact hole CT in a method for monitoring SH of an epitaxial layer of a CMOS device according to an embodiment of this application.

Polysilicon lines (poly lines, PL) are formed on the Active Area (AA) and Shallow Trench Isolation (STI) structures of the measurement reference device, as illustrated in FIG. 2.

The polysilicon lines (poly lines, PL) on the Active Area (AA) structures of the measurement reference device have the same front-rear length and the same left-right width.

The polysilicon lines (poly lines, PL) on the Shallow Trench Isolation (STI) structures of the measurement reference device have the same front-rear length and the same left-right width.

Figure 4:
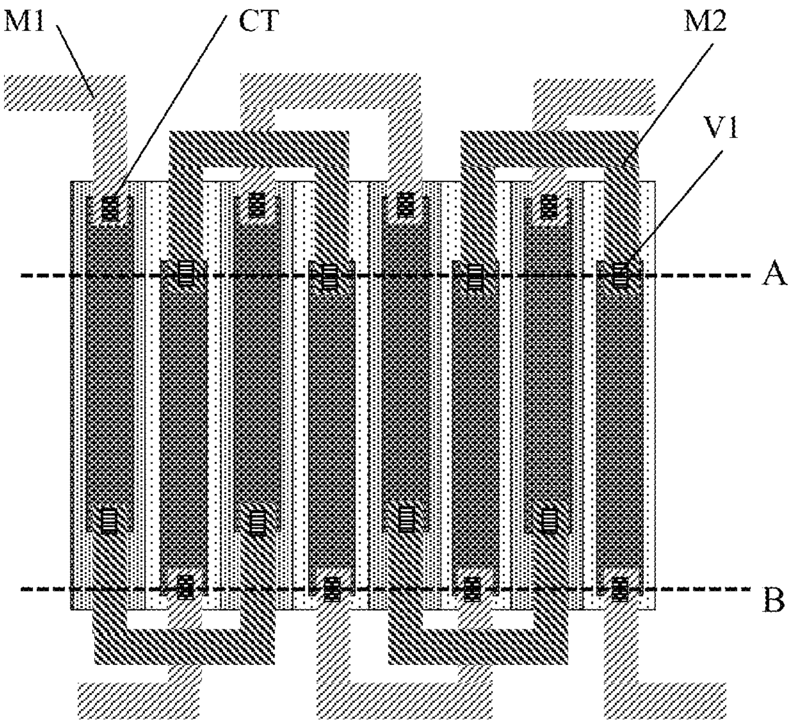
FIG. 4 illustrates a schematic diagram of a first polysilicon line string and a second polysilicon line string in a method for monitoring SH of an epitaxial layer of a CMOS device according to an embodiment of this application.
Figure 5:
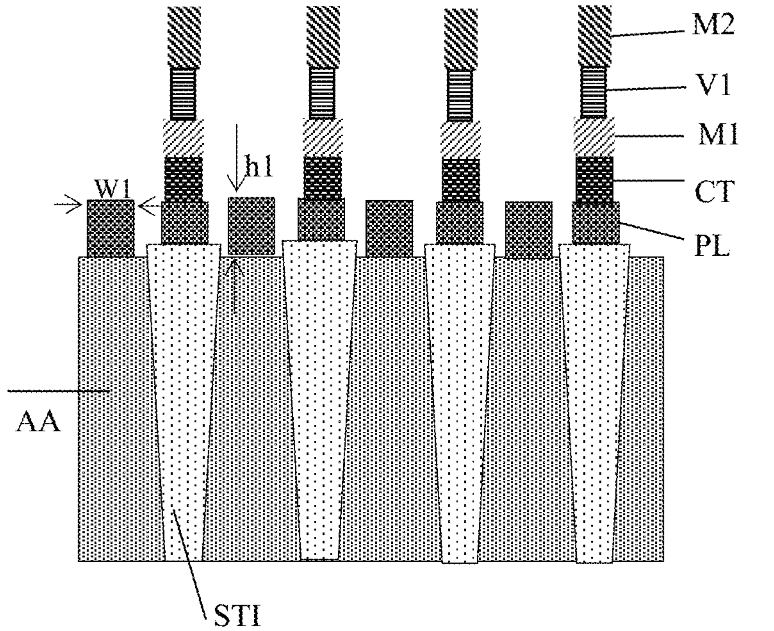
FIG. 5 illustrates a schematic diagram of a longitudinal section of position A in FIG. 4.
Figure 6:
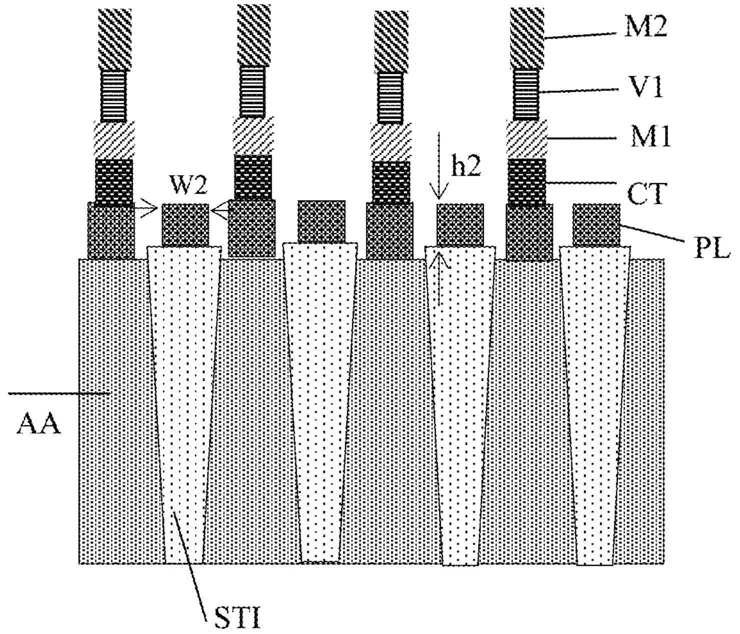
FIG. 6 illustrates a schematic diagram of a longitudinal section of position B in FIG. 4.

The polysilicon lines (poly lines, PL) on the Active Area (AA) structures of the measurement reference device are connected in series through back-end connecting lines to obtain a first polysilicon line string, as illustrated in FIG. 4.

The polysilicon lines (poly lines, PL) on the Shallow Trench Isolation (STI) structures of the measurement reference device are connected in series through back-end connecting lines to obtain a second polysilicon line string, as illustrated in FIG. 4.

In S2, test voltage (force voltage) U is applied respectively to the first polysilicon line string and the second polysilicon line string of the measurement reference device to respectively measure current I1 flowing through the first polysilicon line string and current I2 flowing through the second polysilicon line string.

In S3, calculation is performed to obtain step height SH of an epitaxial layer of the measurement reference device according to the following formula:

$$SH=\rho*L2*I2/(W2*U)-\rho*L1*I1/(W1*U)$$

where ρ is the resistivity of polysilicon, L2 is the front-rear length of the polysilicon lines on the shallow trench isolation structures of the measurement reference device, W2 is the left-right width of the polysilicon lines on the shallow trench isolation structures of the measurement reference device, L1 is the length of the polysilicon lines on the active area structures of the measurement reference device, and W1 is the left-right width of the polysilicon lines on the active area structures of the measurement reference device.

In S4, the step height SH of the epitaxial layer of the measurement reference device is used as step height SH of an epitaxial layer of the CMOS device to be monitored.

According to some embodiments, in step S1, the CMOS device to be monitored and the measurement reference device are fabricated in the same process.

According to the resistance calculation formula R=U/I and the resistance determination formula R=ρ*L/(W*h), it can be calculated h=ρ*L*I/(W*U), where R is the resistance, U is the voltage, I is the current, ρ is the resistivity of polysilicon, L is the length of polysilicon, W is the width of polysilicon, and h is the thickness of polysilicon. The SH of the epitaxial layer of the measurement reference device is calculated according to SH=h2−h1=ρ*L2*I2/(W2*U)−ρ*L1*I1/(W1*U).

In the method for monitoring Step Height (SH) of an epitaxial layer of a CMOS device in embodiment 1, a measurement reference device is fabricated according to a CMOS device to be monitored, Active Area (AA) and Shallow Trench Isolation (STI) structures of the measurement reference device are the same as those of the CMOS device to be monitored, polysilicon lines (poly lines, PL) are formed on the Active Area (AA) and Shallow Trench Isolation (STI) structures of the measurement reference device, the polysilicon lines (poly lines, PL) on the Active Area (AA) structures of the measurement reference device have the same front-rear length and the same left-right width, the polysilicon lines (poly lines, PL) on the Shallow Trench Isolation (STI) structures of the measurement reference device have the same front-rear length and the same left-right width, the polysilicon lines (poly lines, PL) on the Active Area (AA) structures of the measurement reference device are connected in series through back-end connecting lines to obtain a first polysilicon line string, the polysilicon lines (poly lines, PL) on the Shallow Trench Isolation (STI) structures of the measurement reference device are connected in series through back-end connecting lines to obtain a second polysilicon line string, test voltage U is applied respectively to the first polysilicon line string and the second polysilicon line string to respectively measure to obtain current I1 flowing through the first polysilicon line string and current I2 flowing through the second polysilicon line string, and SH of the epitaxial layer of the measurement reference device, which is used as SH of the epitaxial layer of the CMOS device to be monitored, is obtained through calculation according to the current I1 flowing through the first polysilicon line string and the current I2 flowing through the second polysilicon line string. The method for monitoring Step Height (SH) of an epitaxial layer of a CMOS device in embodiment 1 designs a novel Test Socket Kit (TSK), uses electrical structures to test SH of epitaxial layers corresponding to different CMOS device structures, can achieve differential SH monitoring, can reflect the SH difference of different device structures, can compensate for the limitation of inline measurement of SH of epitaxial layers, and can reduce the cost of Transmission Electron Microscope (TEM) analysis.

Embodiment 2

Based on the method for monitoring Step Height (SH) of an epitaxial layer of a CMOS device in embodiment 1, the critical dimension of the polysilicon lines on the Active Area (AA) structures of the measurement reference device is 30%-90% of the left-right width of the Active Area (AA) structures;

the length of the polysilicon lines on the Active Area (AA) structures of the measurement reference device is 60%-90% of the front-rear width of the Active Area (AA) structures;

the critical dimension of the polysilicon lines on the Shallow Trench Isolation (STI) structures of the measurement reference device is 30%-90% of the left-right width of the Shallow Trench Isolation (STI) structures;

the length of the polysilicon lines on the Shallow Trench Isolation (STI) structures of the measurement reference device is 60%-90% of the front-rear width of the Shallow Trench Isolation (STI) structures.

In the method for monitoring Step Height (SH) of an epitaxial layer of a CMOS device in embodiment 2, the Critical Dimension (CD) and length of polysilicon (poly) of the measurement reference device are defined according to the specific sizes of the AA and STI structures.

Embodiment 3

Based on the method for monitoring Step Height (SH) of an epitaxial layer of a CMOS device in embodiment 1, the CMOS device to be monitored and the measurement reference device both have a distribution that the Active Area (AA) structures are spaced apart from the Shallow Trench Isolation (STI) structures, and length directions of both the Active Area (AA) structures and the Shallow Trench Isolation (STI) structures are a front-rear direction;

for the measurement reference device, the polysilicon lines on all Active Area (AA) structures are arranged along the length direction, with front ends aligned, and the polysilicon lines on all Shallow Trench Isolation (STI) structures are arranged along the length direction, with rear ends aligned;

for the measurement reference device, front ends of the polysilicon lines on all Shallow Trench Isolation (STI) structures are located at rear of front ends of the polysilicon lines on the Active Area (AA) structures, and rear ends of the polysilicon lines on all Shallow Trench Isolation (STI) structures are located at front of rear ends of the polysilicon lines on the Active Area (AA) structures.

According to some embodiments, referring to FIG. 3, FIG. 4, FIG. 5 and FIG. 6, the back-end connecting lines on the Active Area (AA) structures and the back-end connecting lines on the Shallow Trench Isolation (STI) structures of the measurement reference device each include a polysilicon contact hole CT, a first metal layer M1, a metal layer via V1, a second metal layer M2, etc.;

the first metal layer M1 is short-circuited to the polysilicon line (poly line) through the polysilicon contact hole CT;

the second metal layer M2 is short-circuited to the first metal layer M1 through the metal layer via V1.

According to some embodiments, the back-end connecting lines on the Active Area (AA) structures and the back-end connecting lines on the Shallow Trench Isolation (STI) structures of the measurement reference device are in a mirror symmetric distribution.

In the method for monitoring Step Height (SH) of an epitaxial layer of a CMOS device in embodiment 3, the Active Area (AA) structures of the measurement reference device are spaced apart from the Shallow Trench Isolation (STI) structures, the length directions of the Active Area (AA) structures and the Shallow Trench Isolation (STI) structures are both a front-rear directions, and the polysilicon lines (poly line) on the Active Area (AA) structures and the polysilicon lines (Poly line) on the Shallow Trench Isolation (STI) structures of the measurement reference device are distributed in a left-right staggered manner in a left-right direction, which can be respectively connected in series through the back-end connecting lines to obtain a first polysilicon line string and a second polysilicon line string.

The above embodiments are only exemplary embodiments of this application and are not intended to limit this application. Any modifications, equivalent replacements, improvements and the like made within the spirit and principle of this application shall be included within the scope of protection of this application.

What is claimed is:

1. A method for monitoring step height of an epitaxial layer of a CMOS device, comprising:

S1: determining a CMOS device to be monitored and fabricating a measurement reference device, active area and shallow trench isolation structures of the measurement reference device being the same as those of the CMOS device to be monitored, polysilicon lines being formed on the active area and shallow trench isolation structures of the measurement reference device, the polysilicon lines on the active area structures of the measurement reference device having the same front-rear length and the same left-right width, the polysilicon lines on the shallow trench isolation structures of the measurement reference device having the same front-rear length and the same left-right width, the polysilicon lines on the active area structures of the measurement reference device being connected in series through back-end connecting lines to obtain a first polysilicon line string, the polysilicon lines on the shallow trench isolation structures of the measurement reference device being connected in series through back-end connecting lines to obtain a second polysilicon line string;

S2: applying test voltage U respectively to the first polysilicon line string and the second polysilicon line string of the measurement reference device to respectively measure current I1 flowing through the first polysilicon line string and current I2 flowing through the second polysilicon line string;

S3: performing calculation to obtain step height SH of an epitaxial layer of the measurement reference device according to the following formula:

$$SH = \rho * L2 * I2/(W2 * U) - \rho * L1 * I1/(W1 * U)$$

where ρ is the resistivity of polysilicon, L2 is the front-rear length of the polysilicon lines on the shallow trench isolation structures of the measurement reference device, W2 is the left-right width of the polysilicon lines on the shallow trench isolation structures of the measurement reference device, L1 is the length of the polysilicon lines on the active area structures of the measurement reference device, and W1 is the left-right width of the polysilicon lines on the active area structures of the measurement reference device; and S4: using the step height of the epitaxial layer of the measurement reference device as step height of an epitaxial layer of the CMOS device to be monitored.

2. The method for monitoring step height of an epitaxial layer of a CMOS device according to claim 1, wherein in step S1, the CMOS device to be monitored and the measurement reference device are fabricated in the same process.

3. The method for monitoring step height of an epitaxial layer of a CMOS device according to claim 1, wherein the critical dimension of the polysilicon lines on the active area structures of the measurement reference device is 30%-90% of the left-right width of the active area structures;

the length of the polysilicon lines on the active area structures of the measurement reference device is 60%-90% of the front-rear width of the active area structures;

the critical dimension of the polysilicon lines on the shallow trench isolation structures of the measurement reference device is 30%-90% of the left-right width of the shallow trench isolation structures;

the length of the polysilicon lines on the shallow trench isolation structures of the measurement reference device is 60%-90% of the front-rear width of the shallow trench isolation structures.

4. The method for monitoring step height of an epitaxial layer of a CMOS device according to claim 1, wherein the CMOS device to be monitored and the measurement reference device both have a distribution that the active area structures are spaced apart from the shallow trench isolation structures, and length directions of both the active area structures and the shallow trench isolation structures are a front-rear direction;

for the measurement reference device, the polysilicon lines on all active area structures are arranged along the length direction, with front ends aligned, and the polysilicon lines on all shallow trench isolation structures are arranged along the length direction, with rear ends aligned;

for the measurement reference device, front ends of the polysilicon lines on all shallow trench isolation structures are located at rear of front ends of the polysilicon lines on the active arear structures, and rear ends of the polysilicon lines on all shallow trench isolation structures are located at front of rear ends of the polysilicon lines on the active arear structures.

5. The method for monitoring step height of an epitaxial layer of a CMOS device according to claim 1, wherein the back-end connecting lines on the active area structures and the back-end connecting lines on the shallow trench isolation structures of the measurement reference device each comprise a polysilicon contact hole, a first metal layer, a metal layer via and a second metal layer;

the first metal layer is short-circuited to the polysilicon line through the polysilicon contact hole;

the second metal layer is short-circuited to the first metal layer through the metal layer via.

6. The method for monitoring step height of an epitaxial layer of a CMOS device according to claim 1, wherein the back-end connecting lines on the active area structures and the back-end connecting lines on the shallow trench isolation structures of the measurement reference device are in a mirror symmetric distribution.

* * * * *